US011979113B2

(12) United States Patent
Eleftheriadis et al.

(10) Patent No.: US 11,979,113 B2
(45) Date of Patent: May 7, 2024

(54) APPARATUS AND A METHOD IN A WIRELESS COMMUNICATIONS NETWORK

(71) Applicant: Telefonaktiebolaget LM Ericsson (publ), Stockholm (SE)

(72) Inventors: Lackis Eleftheriadis, Gävle (SE); Athanasios Karapantelakis, Solna (SE); Vivek Venkiteswaran, Plano, TX (US)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 306 days.

(21) Appl. No.: 17/429,815

(22) PCT Filed: Feb. 12, 2019

(86) PCT No.: PCT/EP2019/053416
§ 371 (c)(1),
(2) Date: Aug. 10, 2021

(87) PCT Pub. No.: WO2020/164688
PCT Pub. Date: Aug. 20, 2020

(65) Prior Publication Data
US 2022/0131501 A1 Apr. 28, 2022

(51) Int. Cl.
H04W 52/00 (2009.01)
H01L 31/02 (2006.01)
(Continued)

(52) U.S. Cl.
CPC ......... *H03F 1/02* (2013.01); *H01L 31/02002* (2013.01); *H02J 1/10* (2013.01); *H04W 88/00* (2013.01)

(58) Field of Classification Search
CPC ........ H03F 1/02; H01L 31/02002; H02J 1/10; H04W 88/00; H04W 52/00; H04B 2001/0408
See application file for complete search history.

(56) References Cited

U.S. PATENT DOCUMENTS 8,659,355 B2 * 2/2014 Henshaw .............. H03F 1/0277
330/136
2004/0043783 A1 3/2004 Anderson
(Continued)

FOREIGN PATENT DOCUMENTS

CN 101729029 A 6/2010
CN 102598564 A 7/2012
(Continued)

OTHER PUBLICATIONS

Giuliano, Romeo, et al., "Power Consumption Analysis and Dimensioning of UMTS-LTE with Relays," Fourth International Conference on Selected Topics in Mobile & Wireless Networking (MoWNet'2014), ScienceDirect, Procedia Computer Science, No. 40, 2014, pp. 74-83.
(Continued)

Primary Examiner — Andrew Wendell
(74) Attorney, Agent, or Firm — Withrow & Terranova, PLLC

(57) ABSTRACT

A method for controlling allotment of power input between at least two PAs of a radio unit for data communication in a wireless communications network is provided. The radio unit has access to Direct Current (DC) power and Photovoltaic (PV) power. The amount of power to be transmitted out from each respective PA out of the at least two PAs established, and information related to the amount of PV power available is obtained. The allotment of power input of DC power and PV power between the at least two Pas is then controlled based on the established amount of power to be transmitted out from each respective PA out of the at least two PAs, and the obtained information related to the amount of PV power available.

20 Claims, 11 Drawing Sheets

(51) Int. Cl.
*H02J 1/10* (2006.01)
*H03F 1/02* (2006.01)
*H04W 88/00* (2009.01)

(56) References Cited

U.S. PATENT DOCUMENTS

| | | | |
|---|---|---|---|
| 2010/0198420 A1 | 8/2010 | Rettger et al. | |
| 2010/0323753 A1* | 12/2010 | Imamura | H04B 7/0689 455/552.1 |
| 2011/0101784 A1 | 5/2011 | Lopez | |
| 2011/0105174 A1 | 5/2011 | Pelletier et al. | |
| 2012/0086280 A1 | 4/2012 | Pan | |
| 2012/0256492 A1* | 10/2012 | Song | H02J 1/102 307/64 |
| 2012/0293118 A1* | 11/2012 | Kim | H01F 38/14 320/108 |
| 2014/0120854 A1* | 5/2014 | Briffa | H03F 1/0227 455/127.3 |
| 2014/0167843 A1* | 6/2014 | Asensio | H03F 3/24 330/127 |
| 2018/0205231 A1 | 7/2018 | Jury et al. | |
| 2019/0107294 A1* | 4/2019 | Yabe | F24H 15/148 |

FOREIGN PATENT DOCUMENTS

| | | |
|---|---|---|
| CN | 107086885 A | 8/2017 |
| EP | 2317623 A1 | 5/2011 |
| WO | 2012115583 A1 | 8/2012 |
| WO | 2017008116 A1 | 1/2017 |

OTHER PUBLICATIONS

Oudjana, S. H., et al., "Power Forecasting of Photovoltaic Generation," World Academy of Science, Engineering and Technology, International Journal of Electrical, Computer, Energetic, Electronic and Communication Engineering, vol. 7, No. 6, 2013, pp. 627-631.
International Search Report and Written Opinion for International Patent Application No. PCT/EP2019/053416, dated Sep. 30, 2019, 9 pages.
First Office Action for Chinese Patent Application No. 201980090670.8, dated Sep. 6, 2023, 8 pages.
Intention to Grant for European Patent Application No. 19705165.9, dated Sep. 6, 2023, 8 pages.
Notification of Grant for Chinese Patent Application No. 201980090670.8, mailed Feb. 28, 2024, 6 pages.
Intention to Grant for European Patent Application No. 19705165.9, mailed Jan. 25, 2024, 8 pages.

* cited by examiner

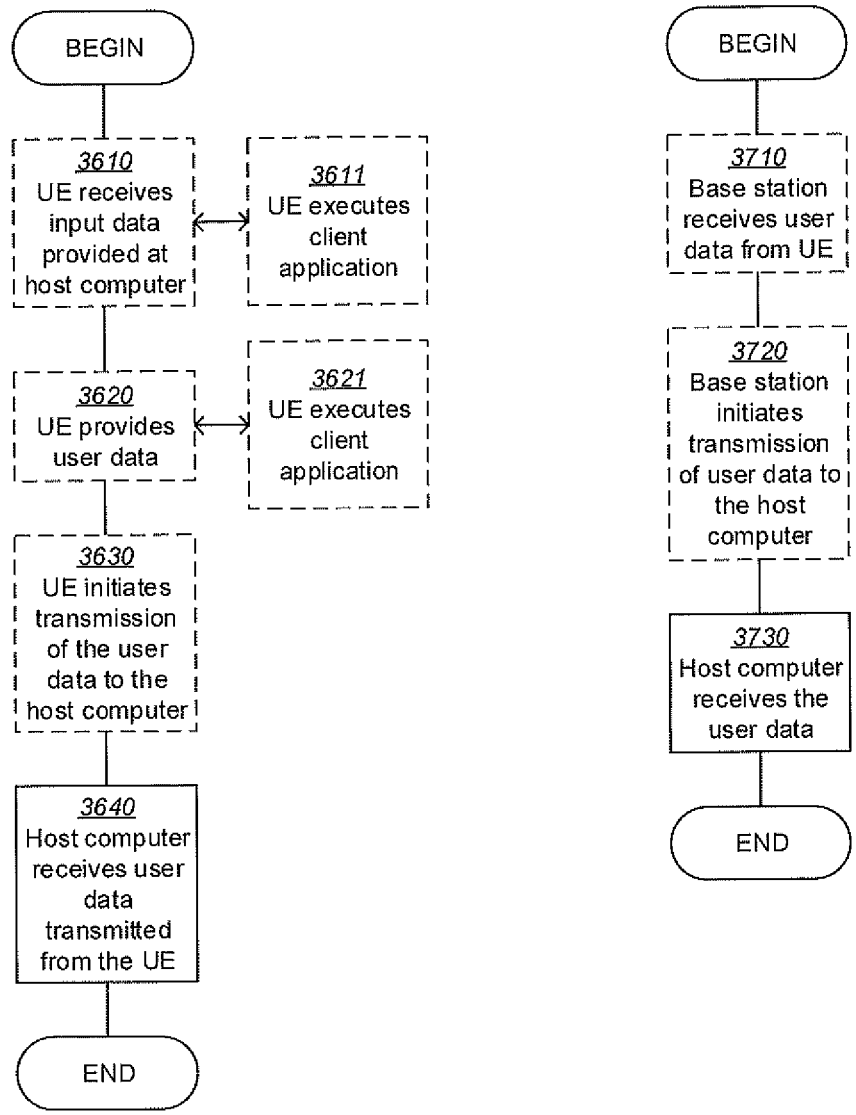

APPARATUS AND A METHOD IN A WIRELESS COMMUNICATIONS NETWORK

This application is a 35 U.S.C. § 371 national phase filing of International Application No. PCT/EP2019/053416, filed Feb. 12, 2019, the disclosure of which is incorporated herein by reference in its entirety.

TECHNICAL FIELD

Embodiments herein relate to an apparatus and a method therein. In particular, they relate to controlling allotment of power input between at least two Power Amplifiers (PAs) of a radio unit for data communication in a wireless communications network.

BACKGROUND

In a typical wireless communication network, wireless devices, also known as wireless communication devices, mobile stations, stations (STA) and/or User Equipments (UE), communicate via a Local Area Network such as a WiFi network or a Radio Access Network (RAN) to one or more core networks (CN). The RAN covers a geographical area which is divided into service areas or cell areas, which may also be referred to as a beam or a beam group, with each service area or cell area being served by a radio network node such as a radio access node e.g., a Wi-Fi access point or a radio base station (RBS), which in some networks may also be denoted, for example, a NodeB, eNodeB (eNB), or gNB as denoted in 5G. A service area or cell area is a geographical area where radio coverage is provided by the radio network node. The radio network node communicates over an air interface operating on radio frequencies with the wireless device within range of the radio network node.

Specifications for the Evolved Packet System (EPS), also called a Fourth Generation (4G) network, have been completed within the 3rd Generation Partnership Project (3GPP) and this work continues in the coming 3GPP releases, for example to specify a Fifth Generation (5G) network also referred to as 5G New Radio (NR). The EPS comprises the Evolved Universal Terrestrial Radio Access Network (E-UTRAN), also known as the Long Term Evolution (LTE) radio access network, and the Evolved Packet Core (EPC), also known as System Architecture Evolution (SAE) core network. E-UTRAN/LTE is a variant of a 3GPP radio access network wherein the radio network nodes are directly connected to the EPC core network rather than to RNCs (Radio Network Controllers) used in 3G networks. In general, in E-UTRAN/LTE the functions of a 3G RNC are distributed between the radio network nodes, e.g. eNodeBs in LTE, and the core network. As such, the RAN of an EPS has an essentially "flat" architecture comprising radio network nodes connected directly to one or more core networks, i.e. they are not connected to RNCs. To compensate for that, the E-UTRAN specification defines a direct interface between the radio network nodes, this interface being denoted the X2 interface.

Multi-antenna techniques may significantly increase the data rates and reliability of a wireless communication system. The performance is in particular improved if both the transmitter and the receiver are equipped with multiple antennas, which results in a Multiple-Input Multiple-Output (MIMO) communication channel. Such systems and/or related techniques are commonly referred to as MIMO.

In addition to faster peak Internet connection speeds, 5G development aims at higher capacity than current 4G, allowing higher number of mobile broadband users per area unit, and allowing consumption of higher or unlimited data quantities in gigabyte per month and user. This would make it feasible for a large portion of the population to stream high-definition media many hours per day with their mobile devices, when out of reach of Wi-Fi hotspots. 5G development also aims at improved support of machine to machine communication, also known as the Internet of things, aiming at lower cost, lower battery consumption and lower latency than 4G equipment.

The demand for 5G radio will increase further in the future. 5G is expected to use higher frequency spectrum to achieve higher speeds. A higher frequency reduces the signal range which thereby increases the demand for more 5G radios to be deployed as compared to 4G. With increased radio equipment deployment the power consumption will increase. Hence with this increasing demand for more radio equipment being deployed, demand for power consumption also increases. At the same time the energy consumption in our society, especially consumption based on fossil fuels, will need to be reduced in order to meet climate goals. Thus, energy efficient operations of network and hardware solutions are needed in order to reduce the energy consumption of radio units and thereby the total power consumption of sites. To save energy in new 5G radio units, new features and traffic control mechanisms are applied on PAs. The PAs may e.g. be connected to antennas of a radio unit and amplify the magnitude of a signal which is input into the amplifier. The traffic control, also referred to as steering, may be based on radios that have two antennas which may transmit (Tx) and receive (Rx) simultaneously (2T/2R), or e.g. radio unit that have 4T/4R and 4 PAs mounted on the radio units. When radio traffic is ongoing in the network, the PA is also allocated respectively.

SUMMARY

As part of developing embodiments herein, a problem was identified by the inventors, and will first be discussed.

Today a PA is fed using a primary Direct Current (DC) input inside the radio unit. The energy to the radio unit is fed from a site power which e.g. may receive power from a grid or a battery of the radio unit. Thus, this power cannot be reduced, which means that no power savings may be achieved in today's infrastructure arrangement.

An object of embodiments herein is to provide more environmental friendly energy to a radio unit in a wireless communications network.

According to a first aspect of embodiments herein, the object is achieved by a method for controlling allotment of power input between at least two PAs of a radio unit. The radio unit is used for data communication in a wireless communications network and has access to Direct Current, DC, power and Photovoltaic, PV, power. The amount of power to be transmitted out from each respective PA out of the at least two PAs is established and information related to the amount of PV power available is obtained. The allotment of power input of DC power and PV power between the at least two PAs is then controlled based on:
  the established amount of power to be transmitted out from each respective PA out of the at least two PAs, and
  the obtained information related to the amount of PV power available.

According to a second aspect of embodiments herein, the object is achieved by an apparatus configured to control allotment of power input between at least two Power Amplifiers, PAs, of a radio unit. The radio unit is used for data communication in a wireless communications network and is adapted to have access to Direct Current, DC, power and Photovoltaic, PV, power. The apparatus is further configured to establish the amount of power to be transmitted out from each respective PA out of the at least two PAs and obtain information related to the amount of PV power available. The apparatus is furthermore configured to control the allotment of power input of DC power and PV power between the at least two PAs based on:

the established amount of power to be transmitted out from each respective PA out of the at least two PAs, and the obtained information related to the amount of PV power available.

The PV power provides more environmental friendly energy than the DC power. Since the allotment of power input of DC power and PV power between the at least two PAs is controlled based on the established amount of power to be transmitted out from each respective PA out of the at least two PAs and the obtained information related to the amount of PV power available, a more environmental friendly energy is provided to the radio unit. This is since the energy sources for the radio unit is complemented with renewable power from the PV power when it is possible.

BRIEF DESCRIPTION OF THE FIGURES

FIGS. 10-13 are flowcharts illustrating methods implemented in a communication system including a host computer, a base station and a user equipment.

DETAILED DESCRIPTION

Some embodiments herein e.g. provide a way of implementing a Photovoltaic (PV) power input of variable power and size directly to a radio unit as well as a control method to control the PV power input. The distribution of the PV power input is controlled based on the PV power production as well as the power consumption of components within the radio unit. This makes it possible to use the more environment friendly PV power. This will be explained in greater detail below.

The same reference signs in the Figures and text correspond to the same features throughout.

Figure 1:
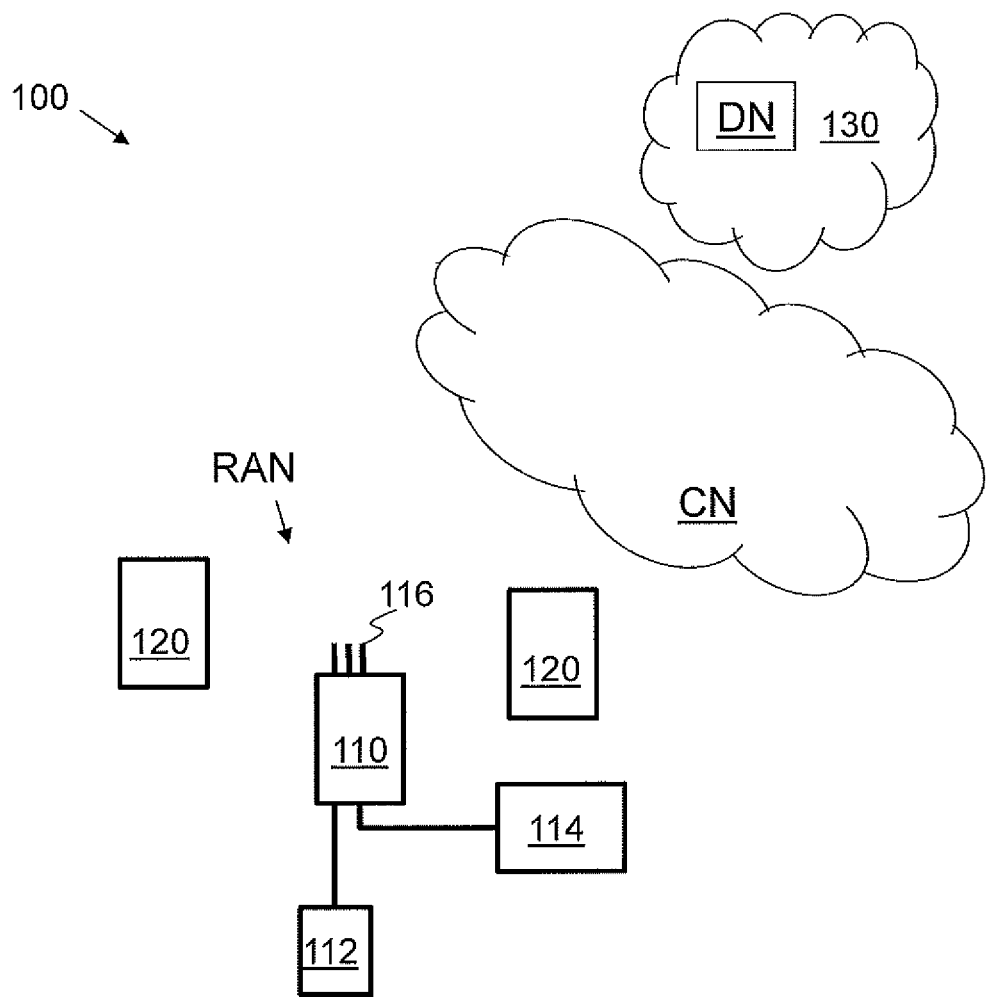
FIG. 1 is a schematic diagram illustrating a wireless communication network.

FIG. 1 is a schematic overview depicting a wireless communications network 100 wherein embodiments herein may be implemented. The wireless communications network 100 comprises one or more RANs and one or more CNs. The wireless communications network 100 may use 5G NR but may further use a number of other different technologies, such as, Wi-Fi, LTE, LTE-Advanced, Wideband Code Division Multiple Access (WCDMA), Global System for Mobile communications/enhanced Data rate for GSM Evolution (GSM/EDGE), Worldwide Interoperability for Microwave Access (WiMax), or Ultra Mobile Broadband (UMB), just to mention a few possible implementations.

Radio units, such as a radio unit 110 for data communication operate in the wireless communications network 100, providing radio coverage by means of a number of antennas 116 providing beams. The radio unit 110 may provide a number of beams also referred to as antenna beams, and may use these beams for communicating with e.g. one or more other radio units 120. The radio units 110, 120 may be radio nodes such as e.g. a base station or a UE.

The radio unit 110 may be a transmission and reception point e.g. a radio access network node such as a base station, e.g. a radio base station such as a NodeB, an evolved Node B (eNB, eNode B), an NR Node B (gNB), a base transceiver station, a radio remote unit, an Access Point Base Station, a base station router, a transmission arrangement of a radio base station, a stand-alone access point, a Wireless Local Area Network (WLAN) access point, an Access Point Station (AP STA), an access controller, a UE acting as an access point or a peer in a Device to Device (D2D) communication, or any other network unit capable of communicating with a radio unit 120 within the cell served by radio unit 110 depending e.g. on the radio access technology and terminology used.

The radio unit 110 has access to Direct Current (DC) power 112, e.g. from a power source delivering DC power or from a power source delivering AC power. In the former case the DC power may be converted to a voltage level suitable for the radio unit 110 through the use of a DC-to-DC converter, also referred to herein as DC/DC. In the latter case the AC power may be converted to DC power through the use of a rectifier (not shown). Either way, suitable power electronics may be provided in the radio unit 110 or in conjunction to the radio unit in order to achieve a desired DC power profile. Since this is well known in the art it will not be described further here. The power source from which the DC power is attained may be e.g. the grid or a battery.

The radio unit 110 furthermore has access to PV power 114. The PV power source may e.g. be photovoltaic solar cells which generate electric power when exposed to light using the photovoltaic effect. The PV power may be provided to the radio unit 110 in the form of direct current. The PV power is more environmental friendly than the DC power. Even though the PV power may be in the form of direct current it is considered a separate entity from the DC power 112 which may be coming from the grid or a battery.

Figure 2:
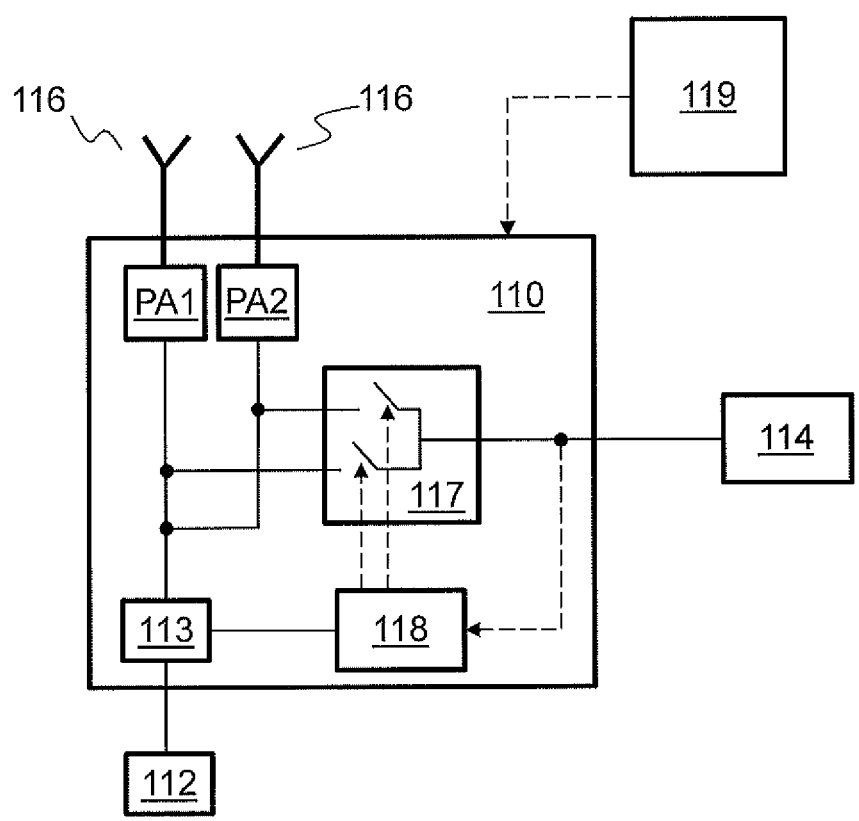
FIG. 2 is a schematic block diagram illustrating embodiments of a radio unit implementation.

In FIG. 2 the radio unit 110 is depicted in more detail according to an example scenario. In the example scenario, the radio unit 110 comprises a first PA, PA1, and a second PA, PA2. The first PA PA1 and the second PA PA2 are connectable to an energy de-multiplexer 117, also referred to as a demux herein. An energy de-multiplexer is used to separate the DC voltage to different consumers, e.g. based on control activated from a controller which will be described further below. Even though two PAs are depicted in FIG. 2, the radio unit 110 may comprise any number of PAs. A source of DC power 112 of the radio unit 110 in FIG. 2 is connected to the radio unit 110 through a DC/DC unit 113 which is connected to the first PA PA1 and the second PA PA2. The DC/DC unit 113 may e.g. be connected to a grid. The radio unit 110 furthermore comprises a Power Rate Controller Function (PRCF) 118, and a source of PV power 114 which e.g. may be a solar cell panel. The PRCF 118 may be a physical controller or a function residing in the cloud 130 as will be explained further below. The PV power from the source of PV Power 114 may be fed to the radio unit 110 via the energy de-multiplexer 117. The energy de-multiplexer 117 may comprise a number of switches, also referred to herein as de-multiplexer switches, which may be closed or opened. Each switch corresponds to a specific PA. By closing a switch, a circuit connecting the PV power 114 to the corresponding PA is closed, thereby allowing that PA to receive power from the source of the PV power 114. Thus, by being arranged to control the switches, the PROF 118 may control which PA receives PV power 114. The PROF 118 may also control the DC/DC unit 113 output voltage. The PROF 118 receives information regarding the PV power 114 available as well as information regarding the power to be fed by the PAs. The information regarding the PV power 114 available may e.g. be established based on the actual current or historical power being produced, e.g. by measuring the voltage and current in the circuit. The PV power 114 available may also or alternatively be established based on current or historical weather information. The information regarding the power to be transmitted by the PAs may e.g. be received from a radio traffic scheduler 119 in baseband (BB). A radio traffic scheduler 119 schedules the traffic in the network and therefore has information about the traffic allocation in the network. The traffic allocation of each PA is correlated to the power transmitted from the respective PA. Thus, the radio traffic scheduler 119 may provide information regarding the power transmitted from the PAs to the PROF 118. The PROF 118 may then control the energy de-multiplexer 117 such that the energy efficiency of the system is increased, e.g. by controlling the energy de-multiplexer 117 such that the PA consuming the most amount of power is allotted the PV power 114 produced. The radio unit 110 may be comprised in an apparatus 700, not shown in FIG. 2, but will be described further below together with FIG. 7.

Figure 3:
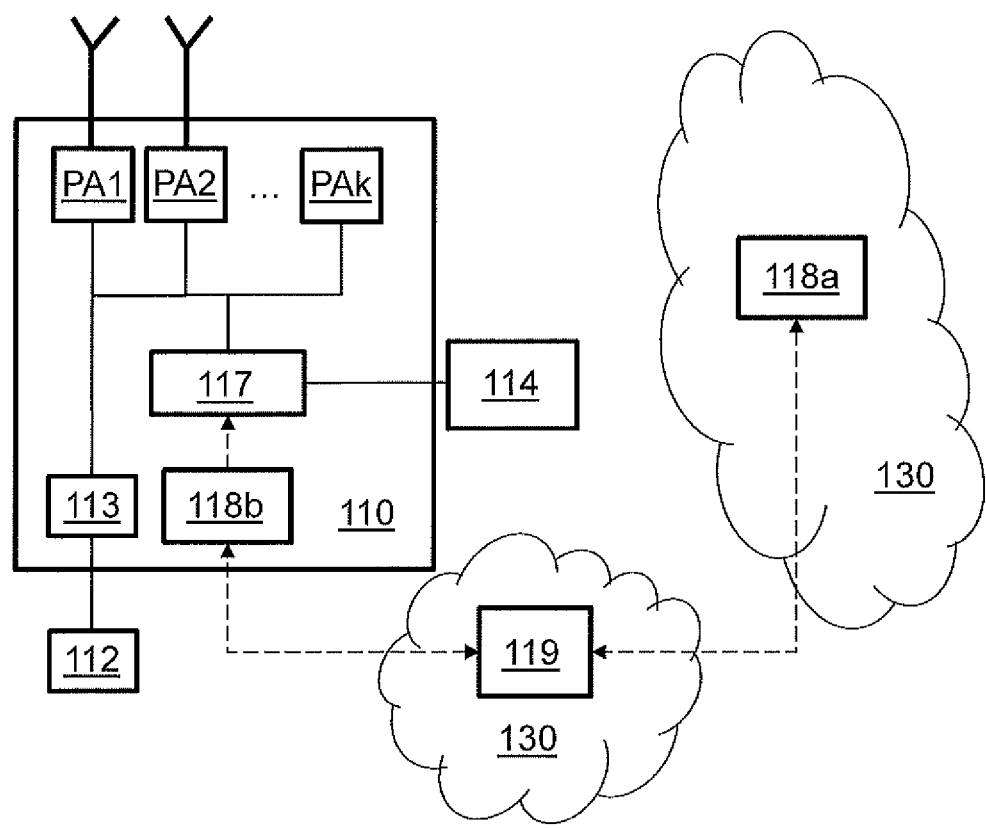
FIG. 3 is a schematic block diagram illustrating embodiments of a cloud implementation.

FIG. 3 illustrates a distributed implementation, also referred to as a cloud implementation, of the apparatus 700 according to an example scenario. The radio traffic scheduler 119 in BB may in this example scenario be located as a function in the cloud 130. The difference compared with the implementation shown in FIG. 2, is that the PROF 118 is split into two entities: a client 118b and a server 118a.

In the cloud implementation the PROF server 118a may be responsible for determining, e.g. by computation, which PA or which several PAs that are to be connected to the PV power 114. If the energy de-multiplexer 117 is utilized as is illustrated in FIG. 3, the PROF server 118a determines which actuator in the energy de-multiplexer 117 to actuate. This information is then relayed to the PROF client 118b via for example the data traffic scheduler 119. Based on the information received the PROF client 118b may control which PA is connected to the PV power 114, e.g. by actuating the controls in the energy de-multiplexer 117. It may also report to the PROF server 118a the current PV power 114 production, e.g. by transmitting data obtained by measuring the current voltage and current. In the cloud implementation the PROF server 118a may e.g. be running in the cloud 130, e.g. on a server in a data center and the PROF client 118b may e.g. be located in the radio unit 110. Several radio units 110 may be controlled by one PROF server 118a and client 118b configuration. The cloud implementation will be described further below.

Figure 4:
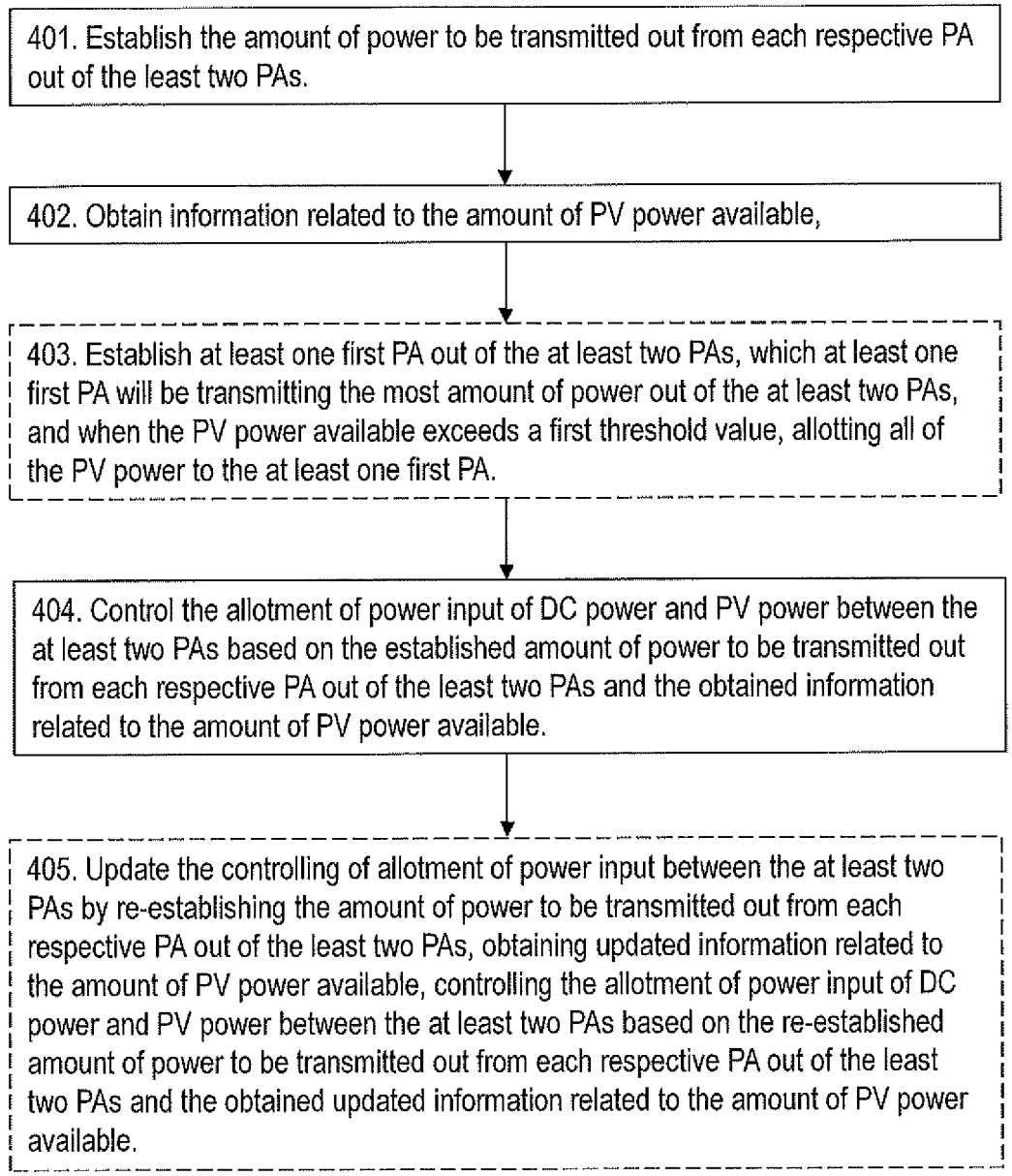
FIG. 4 is a flowchart depicting embodiments of a method in an apparatus.

Example embodiments of a method for controlling allotment of power input between at least two PAs of the radio unit 110 for data communication will now be described with reference to a flowchart depicted in FIG. 4. As mentioned above, the radio unit 110 operate in the wireless communication network 100 and has access to DC power 112 and PV power 114. The actions below may be performed by any one or more out of the radio unit 110, a separate non-virtualized node or a separate node hosted in a public or private cloud 130, such as e.g. by a server, a Distributed Node DN or functionality in the cloud 130.

The method comprises the following actions, which actions may be performed in any suitable order. Dashed boxes represent optional method steps.

Action 401.

Since the radio unit 110 has access to the PV power 114 in addition to the DC power 112 the radio unit 110 may use PV power 114 as soon as it is possible. Thus, since PV power 114 is a renewable energy source, a more environmental friendly operation is achieved. Furthermore, the noise generation may also be lower as will be explained further below. However, in order to achieve this, the amount of power transmitted by the PAs of the radio unit 110 may be determined. The amount of power to be transmitted out from each respective PA out of the at least two PAs is thus established.

The amount of power transmitted out of a PA is correlated to the amount of power consumed by this PA and is thus a measure of the amount of power the PA need in order to operate. The amount of power consumed by the PA may depend on the traffic allocated to the PA. Thus, the amount of power transmitted out of each respective PA may e.g. be established based on information related to the amount of power consumed by the respective PA, the amount of traffic allocated to the PA etc. The information related to the amount of power consumed by the respective PA may e.g. be determined by the radio traffic scheduler 119 related to the radio unit 110.

The amount of power to be transmitted out from each PA out of the at least two PAs may be established by a respective previous prediction of the amount of power to be transmitted out from each respective PA out of the at least two PAs. The respective prediction is based on the amount of historical traffic generated.

The amount of power to be transmitted out from each respective PA out of the at least two PAs may e.g. be established based on machine learning.

Action 402

In order to use the power produced by the PV source in a practical and efficient manner it is important to know how much power is being produced. Since the PV source is solar energy, which is a very intermittent renewable energy source the amount of power may vary considerably at short, medium and long timescales.

Thus, information related to the amount of PV power 114 available, e.g. currently available, is obtained.

The information related to the amount of PV power 114 available may relate to any one or more out of current power measurements of the PV power 114, historical power measurements of the PV power 114, the current weather surrounding the radio unit 110 and the historical weather surrounding the radio unit 110. The current or historical weather surrounding the radio unit 110 may for instance be the amount of sunlight irradiation, the temperature, the time of day etc.

The amount of PV power 114 available may in some embodiments be obtained by a previous prediction of the amount of PV power 114 available, wherein the previous prediction is based on one or more out of PV power 114 production, light irradiation, temperature, time of day, the altitude at which the PV power source is located and the efficiency of the PV power source. The previous prediction may furthermore be based on the date, the atmospheric humidity, precipitation etc.

The information related to the amount of PV power 114 available may be obtained based on machine learning.

Action 403

As a preliminary step before allotment of the power input in some embodiments, at least one first PA out of the at least two PAs is established. The at least one first PA will be transmitting the most amount of power out of the at least two PAs.

Action 404

Having determined both the PV power 114 produced as well as the power consumed by the PAs it is possible to distribute the power input from DC power 112 and PV power 114 between the different PAs, depending on their needs.

Thus, the method further comprises controlling the allotment of power input of DC power 112 and PV power 114 between the at least two PAs based on the established amount of power to be transmitted out from each respective PA out of the at least two PAs, and the obtained information related to the amount of PV power 114 available.

In the embodiment wherein a first PA is established out of the at least two PAs, as described in action 403 above, when the PV power 114 available exceeds a first threshold value, all of the PV power 114 is allotted to the at least one first PA. By distributing all of the PV power 114 to the PA which consumes the most amount of power the available PV power 114 is used in an efficient manner. Furthermore, the amount of noise generated may be reduced.

The first threshold value may e.g. be the amount of power used by the PA which transmits the most amount of power. The first threshold value may also be a fixed value, e.g. a value of 20 W, 40 W, 60 W or 80 W or any other value defined as suitable.

In some other embodiments, if the amount power used by the PA which transmits the most amount of power is greater than the PV power 114 available, then the PV power 114 may be distributed to the PA transmitting the second most amount of power and so forth. Alternatively, all the PV power 114 may be still be allotted to the PA which transmits the most amount of power and the extra power needed to feed that PA may be received from the DC power 112. The DC power 112 may in that case be adjusted so that the right amount of power reaches the PA.

Action 405

The available PV power may fluctuate continuously as the light intensity which is used to produce the PV power changes over time. It is therefore advantageous to continuously adapt the distribution of the power to the PAs in order to achieve a high efficiency. The controlling of allotment of power input between the at least two PAs is thus updated by:

re-establishing the amount of power to be transmitted out from each respective PA out of the at least two PAs, obtaining updated information related to the amount of PV power available, and controlling the allotment of power input of DC power and PV power between the at least two PAs based on:

the re-established amount of power to be transmitted out from each respective PA out of the at least two PAs, and the obtained updated information related to the amount of PV power available.

The updating may be performed at a time interval which e.g. is related to a Transmission Time Interval (TTI) of the data communication.

A TTI is the duration of a transmission on the radio link and depends on the size of the data blocks used for the communication. One TTI may e.g. correspond to 1 ms for LTE and lower than 70 us for NR. The update interval may e.g. range from a very fast update process where the control is updated every TTI to slower update intervals of several TTIs. The slower process may range from 2 TTIs to several seconds. Using a fast update process will result in a high accuracy since changes in PV power production and power consumption of the PAs may be followed very closely. It is however hard to virtualize such a fast update algorithm since the software executing the algorithm needs to be in close vicinity to the physical hardware, such as e.g. the radio unit 110. Thus, by using a slower updating process a higher latency may be allowed, the software may in this case e.g. be placed in a datacentre connected to the radio unit 110.

When using an updating time interval greater than 1 TTI it may be advantageous to find the updating time interval which is optimal according to certain criteria, for example to reach a certain accuracy. By finding an optimal update time interval a more robust and optimized method is achieved. Furthermore, the operation will also be more accurate. In some embodiments the updating time interval may be determined based on machine learning. Machine learning may for instance be used to plan in intervals greater than 1 TTI, by e.g. predicting environmental conditions and the amount of future traffic generated based on historical data. The machine learning models used may e.g. be based on Deep Neural Networks (DNN).

The controlling of allotment of power input between the at least two PAs may furthermore be updated by further comprising re-establishing at least one second PA out of the at least two PAs, which second PA will be transmitting the most amount of power out of the at least two PAs. In this case, when the PV power available exceeds a first threshold value, all of the PV power is allotted to the second PA.

The second PA may be the same as the first PA, i.e. in that case the first PA is still the PA which will be transmitting the most amount power. As was described above, by distributing all of the PV power 114 to the PA which consumes the most amount of power the available PV power is used in an efficient manner. Thus it is advantageous to perform this determination at each update.

The method described above will now be further explained and exemplified.

Herein is described how to implement a PV power 114 input of variable power and size to the radio unit 110, as well as the method to control the PV power 114 input towards specific PAs. The PV power 114 source may be connected to the specific PA via the energy de-multiplexer 117. The PV power 114 may be distributed amongst several PAs or all of the power may be allotted to the highest power-consuming PA. The energy de-multiplexer 117 may be controlled by a PROF 118. The PROF 118 may receive data concerning the power to be transmitted from each PA from a radio traffic scheduler 119. The PROF 118 may use this data to control the energy de-multiplexer 117 to supply PV power 114 to the PA consuming the most amount of power.

As was explained above, the radio traffic scheduler 119 may be the component which allocates the radio traffic towards each PA. Each traffic allocation corresponds to a certain power level. The corresponding power levels may be sent from radio traffic scheduler 119 to the PROF 118. In addition, the PA having the highest allocated power level may also be indicated by the information sent from the radio traffic scheduler 119. This information may be known to the radio traffic scheduler 119 one TTI in advance. Thereby a control mechanism for controlling e.g. the energy de-multiplexer 117 to distribute the PV power 114 between the PAs is created. The control mechanism may thus e.g. feed all of the PV power 114 to the PA consuming the most amount of power. Through this control method, the energy needed from DC power 112 obtained from the grid or other sources than the PV source is reduced.

The provided method for controlling allotment of power input between at least two PAs of a radio unit 110 for data communication will now be further explained through example scenarios. According to the scenarios the PROF 118 schedules PV-supplied power based on current power consumption, also referred to as provisioning characteristics, and historical measurements.

The PROF 118 may be a logical component. As has been described and will be described in more detail below, it may physically reside within the radio unit 110, on a digital ASIC of the radio unit 110, as a cloud 130 function, e.g. in a server within a data center etc. In the following general description the PROF 118 will be described as a single entity with the understanding that the same functions could e.g. be performed by a PROF 118 which is split into a PROF client 118b and a PROF server 118a as was described above.

The PROF 118 may thus be capable of receiving a number of different inputs, e.g. in the form of data related to any one or more out of:

The amount of power, e.g. in Watts, to be transmitted out from every PA. This may be received from the radio traffic scheduler 119.

Current and historical voltage and/or current measurements from every PA.

Current and historical voltage and/or current measurements of the PV power 114.

Weather information such as e.g. solar irradiance, temperature etc.

Possible outputs from the PROF 118 may e.g. be any one or more out of:

To use an adjustable output voltage distribution $V_{adjust}$ of the DC power 112 or use only DC power 112. The latter may e.g. be used when the weather is bad or during nighttime.

The ON or OFF states of the connections between the PV source and the different PAs, i.e. whether a given PA receives PV power 114 or not. This may e.g. correspond to a state within the energy de-multiplexer 117. For example, in the special scenario where only two PAs are used the ON/OFF state of PV control 1 and PV control 2 may be output.

The radio traffic scheduler 119 may provide information regarding the power allocation of each PA one TTI in advance. The power allocation of each PA is the power each PA will transmit in the next TTI. The power allocation may e.g. be expressed in percentage of traffic, or in Watts. The radio traffic scheduler 119 may determine the value in average and/or peak Watts given the value in percentage of traffic, since the amount of traffic is directly proportional to the amount of power required to channel this traffic.

An advantage is that embodiments provided herein may reduce the noise stemming from the PAs, since PV power have lower noise than DC/DC. Thus, an advantage is that a gain in the noise difference levels on the PA voltage is achieved. A PV source, e.g. a solar cell panel, has no active components compared to DC/DC where switching arrangements produce noise. This noise needs to be filtered on the PA bus voltage. This means that the Digital Pre-Distortion (DPD) does not need to compensate for noise from PV power as compared to power from DC/DC in such high degree.

A yet further advantage is that the method and apparatus 700 may adapt to variable weather condition patterns by adjusting the DC/DC output voltage via a output voltage adjustment interface ($V_{adj}$), to the PAs. This may be done in order to increase the power taken from the PV. When sunlight is diffuse the power may e.g. be reduced from the PV source.

A further advantage is that machine learning algorithms may be used to plan in intervals of longer time, by predicting environmental conditions and the amount of future traffic generated based on historical data, making the apparatus 700 and method robust and adaptable.

As was described above, the control may be updated at a time interval which is related to a TTI of the data communication. Two scenarios are exemplified below, a fast update which occurs once every TTI and a slower update which occurs at an interval equal to or greater than two TTIs.

Fast Update—Execution Every TTI

In a first example scenario, the updating of the controlling of the allotment is performed every TTI. Thus, the controls connecting the PV power 114 to the PAs are actuated in every TTI. This may correspond to the timings of the radio traffic scheduler 119. In order for the controlling of the allotment to be updated the PRCF 118 also need to run every TTI, since the PRCF 118 according to this scenario schedules the PV power 114. As has been described above, one advantage of the fast update is the high accuracy achieved. A possible draw-back may be that the software executing the PRCF 118 needs to be physically very close to the radio unit 110 so that the PV controls may be actuated within a TTI. An example of such an implementation has been described in conjunction with FIG. 2 above and will be described further under radio unit implementation below. Having this function close to the hardware, not only renders the cost expensive, but runs counter to the current trend within 5G of virtualization of network functions. This virtualization is performed for among other things cost reasons.

The fast update will yield fine-grained results and relies on currently results of power and weather.

A possible algorithm that may be used in the fast update scenario will now be described in conjunction with FIG. 5 which shows the flow of information in this scenario. The following notation will be used:

Let $PA_{1alloc}, PA_{2alloc}, \ldots PA_{Nalloc}$ be the power allocated to $PA_1, PA_2 \ldots PA_N$ respectively, from e.g. the radio traffic scheduler 119. This information may be extrapolated from the amount of traffic allocated.

Let $PV_{pwr}$ be the power currently produced by PV.

Let $PV_{control1}, PV_{control2}, \ldots, PV_r$ be the current state of control 1, 2, ... r. The state may be OPEN or CLOSED. In the OPEN state the switch is open, i.e. no current may flow through and thus no PV power will be distributed to the corresponding PA. In the CLOSED state the switch is closed, i.e. current may flow through and thus power will be distributed to the corresponding PA. With current state is herein meant what the outcome was of the decision in the previous TTI.

Figure 5:
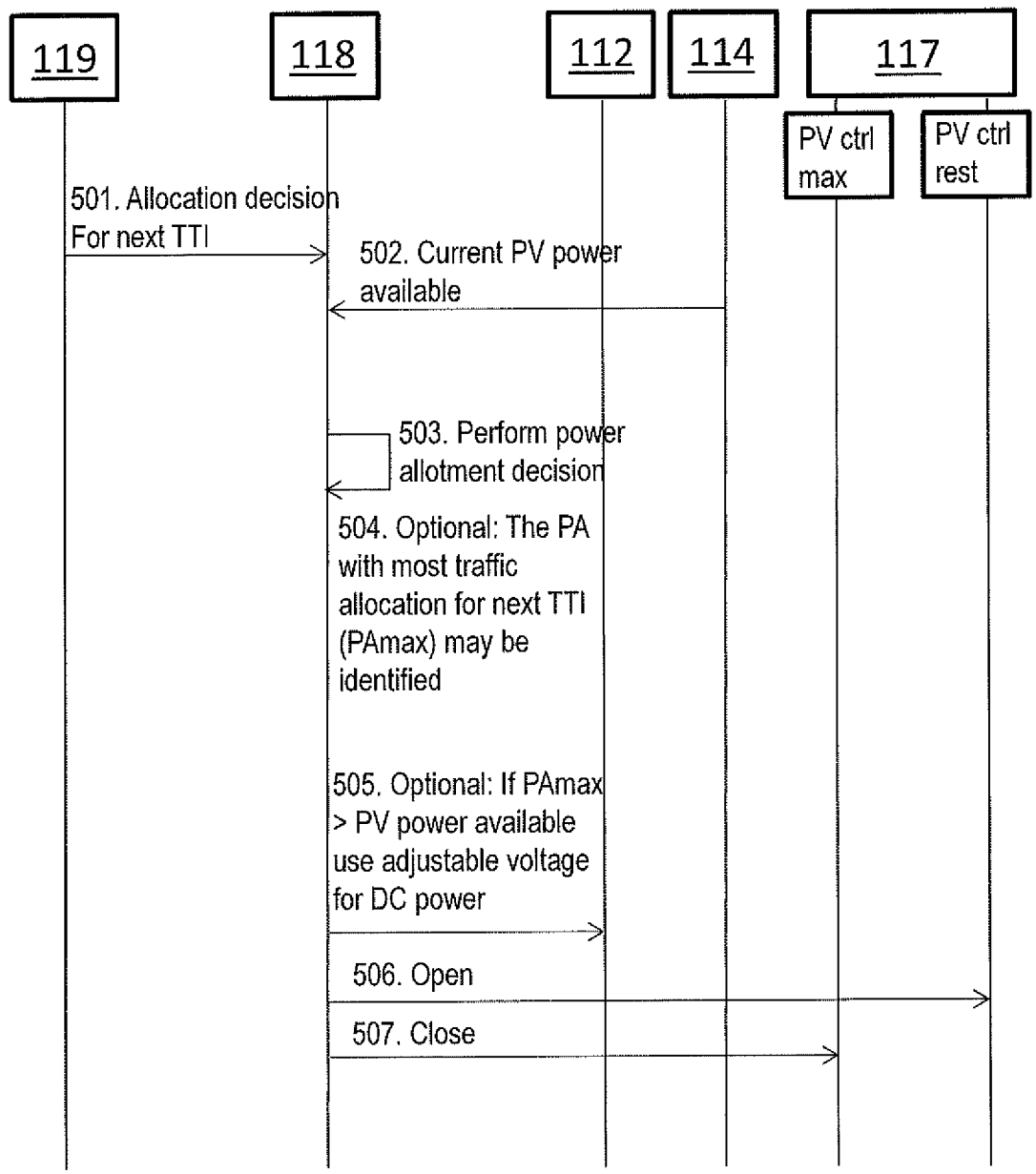
FIG. 5 is a sequence diagram illustrating embodiments of a method.

Let "PV ctrl max" in FIG. 5 denote the PV controls for those one or more PAs which have been chosen to receive PV supplied power 114.

Let "PV ctrl rest" in FIG. 5 denote the PV controls for those one or more PAs which have been chosen to not receive PV supplied power 114.

The steps outlined in FIG. 5 will now be described further.

Action 501

First the power allocated $PA_{1alloc}, PA_{2alloc}, \ldots PA_{Nalloc}$ to each of the PAs $PA_1, PA_2 \ldots PA_N$ respectively is transmitted from the radio traffic scheduler 119 to the PRCF 118. Thus, the PRCF 118 may establish the power to be transmitted out from each PA.

Action 502

Then the PRCF 118 obtains the current PV power 114 available. This may e.g. be obtained through measured current and voltage values at the PV source which is transmitted to the PRCF 118.

Action 503

Based on the established power to be transmitted out from each PA and the current PV power 114 available the PROF 118 performs a power allotment decision, i.e. how to distribute the PV power 114 and the DC power 112 to the PAs.

Action 504

As part of the power allotment decision the PA having the highest traffic allocation in the next TTI may be identified as $PA_{max}$.

Action 505

If the $PA_{max}$ is identified the PROF 118 may check if the power to be transmitted out from the PA identified as $PA_{max}$ is greater than the current PV power 114 available. In that case the adjustable voltage distribution $V_{adjust}$ of the DC power 112 may be used. The PROF 118 may then control the output voltage from the DC/DC unit 113 accordingly such that the right amount of power is received for each PA from the DC/DC unit 13 and the PV power 114, thus If $PA_{max}$>PV power available use adjustable voltage for DC power 112.

Actions 506-507

The PROF 118 may then control the energy de-multiplexer 117 based on the allotment decision by opening, action 506, or closing, action 507, the appropriate PV controls.

The decision algorithm to actuate the power controls may more formally be as follows:

Find $PA_{max}$=max ($PA_{1alloc}, PA_{2alloc}, \ldots, PA_{Nalloc}$)
  If $PA_{max} <= PV_{pwr}$
    If $PV_{controlmax}$==OPEN
      $PV_{controlmax}$=CLOSED
    Set all other $PV_{control}$ to OPEN
  ELSE
    Adjust voltage using $V_{adjust}$
    If $PV_{controlmax}$==OPEN
      $PV_{controlmax}$=CLOSED
    Set all other $PV_{control}$ to OPEN For the case of the max function returning two or more PAs, e.g. in the two PA scenario where the traffic allocation is 50%-50%, then one of the PAs may be chosen at random to receive the PV power 114.

Slow Update—Execution Every Multiple TTIs

In the second example scenario, the updating of the controlling of the allotment is performed at every multiple of TTIs, e.g. every second TTI or once every $10^{th}$ TTI, etc. Thus, the controls connecting the PV power 114 to the PAs are actuated after multiple TTIs have elapsed. The time elapsed may range from 2 TTIs to many seconds.

Having a slower updating process requires more planning to be performed. Since the updating time interval allows for a few miliseconds (ms) or more in low latency applications, the updating function may not need to be as close to the radio unit 110 as in the fast updating scenario. The software function may in this case be executed in a server in a datacenter and may e.g. be connected to the radio unit 110 using an optical fiber front haul, e.g. the Common Public Radio Interface, CPRI. This may e.g. be the case for Cloud RAN type deployments. An example of such an implementation has been described in conjunction with FIG. 3 above and will be described further under cloud implementation below.

Thus, the slow update scenario is delay tolerant and relies on historical data values.

In order to distribute the power between the PAs in an efficient manner the amount of power to be transmitted out from each respective PA during the time interval need to be established. Furthermore, information related to the amount of PV power available during the time interval need also be obtained. Since the actual values are not available they need to be obtained such as be predicted. For purposes of illustration it is assumed here that the prediction is performed for k TTIs. Instead of direct comparisons of power values as for the fast update scenario, models of values are used in the slow update scenario. The models predict what the allocated values to the PAs as well as the supplied PV power 114 will be for the next k TTIs. The allocated values may be allocated by a power allocator such as a radio traffic scheduler 119 and the models then predict how much power the allocator will allocate a given PA.

The models may be built based on historical data. If the semantics of the data is known, e.g. that the data is characterized as power measurements, the data may be considered as labeled. Models for labeled data may therefore be used, e.g. different types of regression techniques such as DNN may be used. As has been described above, variables such as PV power production, irradiation and temperature are correlated to the power production. Other examples of variables influencing the power production may be the time of day, the time of year, the altitude at which the PV power source is located, the date, the atmospheric humidity, precipitation etc. Thus, these variables may be used as input for the models, e.g. as inputs to the DNN. These variables may herein also be referred to as independent variables. Actual values of the available PV power may be used in conjunction with the independent variables in order to train the model. The actual values may e.g. be the actual power produced as measured by the current and voltage at the PV source. When the model is trained the power production may then be predicted based on current values of the independent variables. A similar correlation may be made for power allocation to the PAs, or for the power allocation the scheduler will allocate to the PAs. The allocation may be based on the amount of traffic generated. The amount of traffic generated is correlated to the number of active users. Thus, the independent variables for the power allocation prediction may be the traffic generated or the number of active users.

Figure 6:
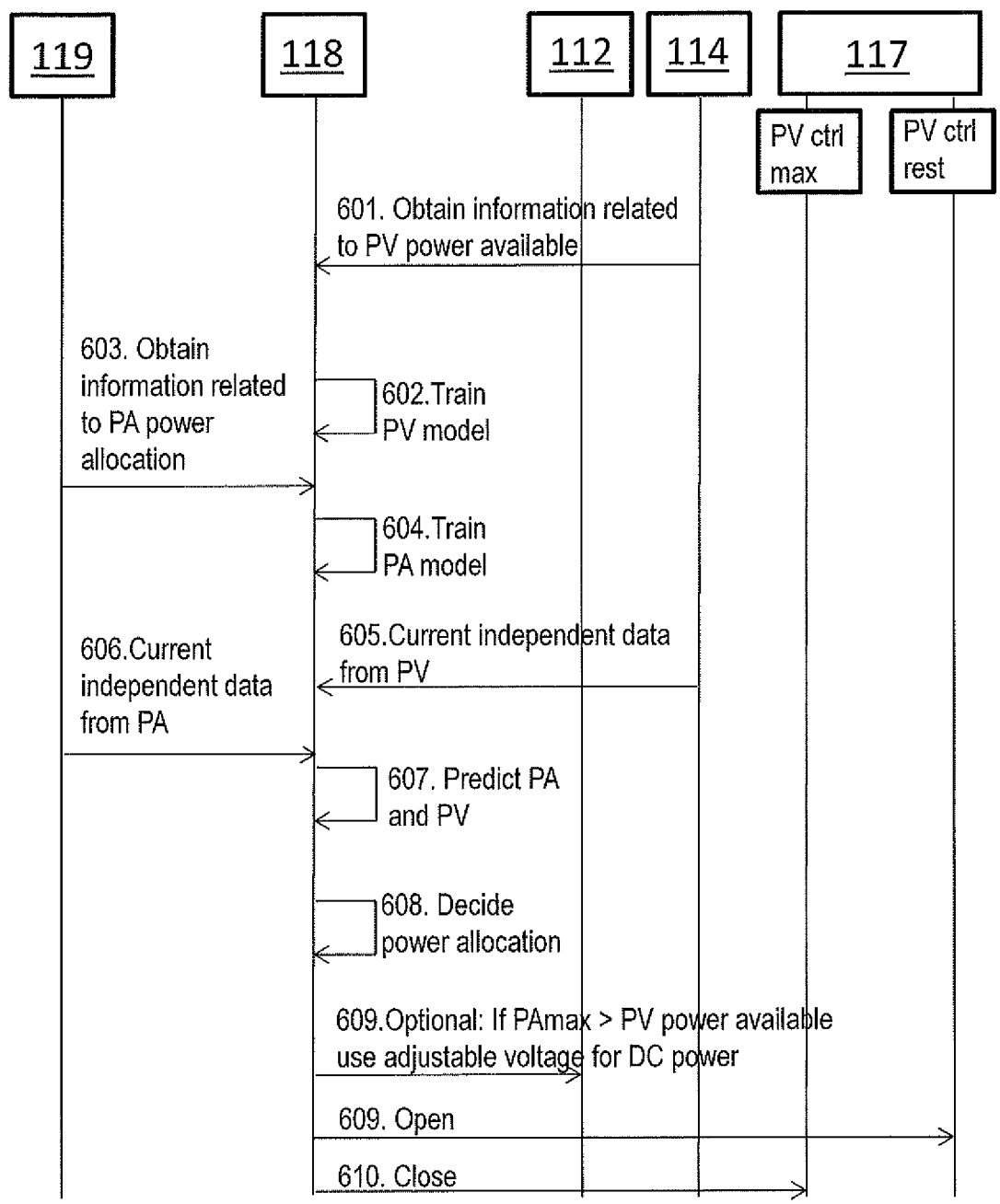
FIG. 6 is a sequence diagram illustrating embodiments of a method.

A possible algorithm that may be used in the slow update scenario will now, similarly to the fast update scenario, be described in conjunction with FIG. 6 which shows the flow of information in this scenario.

For purposes of illustration, it is assumed that there exists a function that provides a prediction of the power production $PV_{pwr}$ for the next k TTIs. This prediction may e.g. be an average value per TTI, or a cumulative value for all k TTIs. Thus:

$PV_{pwr}=f(P_{iv1}, P_{iv2}, \ldots P_{ivx})$, where $P_{iv1}, P_{iv2}, \ldots P_{ivx}$ are independent variables such as the ones mentioned above with regards to predicting the PV power production.

Similarly, there exists another function for predicting the power to be transmitted out from each respective PA for the next k TTIs. For example, the function may predict the allocated power $PA_{kpwr}$ to every $PA_k$ from the radio scheduler for the next k TTIs. Thus:

For every $PA_k$ in $(PA_1, \ldots, PA_n)$, there exists a function y such that:

$PA_{kpwr}=y(S_{iv1}, S_{iv2}, \ldots S_{ivx})$, where $S_{iv1}, S_{iv2}, \ldots S_{ivx}$ are independent variables such as the ones mentioned above with regards to predicting the power allocation to the PAs.

As in the fast update scenario, let $PV_{control1}$, $PV_{control2}, \ldots, PV_r$ be the current state of control 1, 2, . . . r. The state may be OPEN or CLOSED. In the OPEN state the switch is open, i.e. no current may flow through and thus no PV will be distributed to the corresponding PA. In the CLOSED state the switch is closed, i.e. current may flow through and thus power will be distributed to the corresponding PA. With current state is herein meant what the outcome was of the decision in the previous TTI.

"PV ctrl max" and "PV ctrl rest" in FIG. 6 correspond to the same features as described above in conjunction with FIG. 5.

The steps outlined in FIG. 6 will now be described further. Actions 601-604 are performed in order to train the models described above. Those steps are therefore performed continuously and simultaneously to actions 605-611. These latter steps are performed in order to control the power allotment to the PAs.

Action 601

In order to build the models, data is needed. Thus, data regarding the independent variables discussed above is collected. In step 601 the PRCF 118 obtains data related to the PV power 114 available, e.g. in the form of the actual power produced obtained through direct power measurements, e.g. the current and voltage of the PV source, as well as indirect data of independent variables such as light irradiation, temperature, time of day etc. This data may be collected at the PV source and transmitted to the PRCF 118.

Action 602

Based on the data received in step 601 the model describing the production of PV power may in step 602 be trained by the PRCF 118.

Action 603

In order to build the model for the prediction of PA allocation, data needs to be collected in a similar manner as for the PV power model. Thus, data regarding the PA power allocation is collected. The data may be collected by the radio traffic controller 119 and be transmitted to the PROF 118. The data collected may comprise the actual power allocated for each PA as well as independent variables such as e.g. the number of active users, the geographic location, the time of day etc.

Action 604

Based on the data received in step 603 above, the model describing the PA power allocation may in step 604 be trained by the PROF 118.

Action 605

The PROF 118 collects current independent data for the PV power 114. The independent data may e.g. be light irradiation, temperature, time of day etc. The data may e.g. be collected at the PV source and be transmitted from the source site to the PROF 118.

Action 606

The PROF 118 collects current independent data for the PA power allocation, such as e.g. number of active users, the time of day, the geographical location etc. The data may be collected by the radio traffic scheduler 119 and transmitted to the PROF 118.

Action 607

Now the PROF 118 may predict the power allocated PA1alloc, PA2alloc, . . . PANalloc to each of the PAs PA1, PA2 . . . PAN for k TTIs in the future by using the trained model for PA power allocation. Similarly the PROF 118 may also predict the PV power 114 available for k TTIs using the trained model for PV power production.

Action 608

Having predicted the PA power allocation and the PV power production the PROF 118 may decide a power allotment.

Action 609

As part of the power allotment decision the PA having the highest traffic allocation in the next k TTIs may be identified as $PA_{max}$. If the $PA_{max}$ is identified the PROF 118 may check if the power to be transmitted out from the PA identified as $PA_{max}$ is greater than the current PV power 114 available. In that case the adjustable voltage distribution $V_{adjust}$ of the DC power 112 may be used. The PROF 118 may then control the DC/DC unit 113 output voltage accordingly such that the right amount of power for each respective PA is received from the DC/DC unit 113 and the PV power 114, thus If $PA_{max}$>PV power 114 available use adjustable voltage for DC power 112.

Action 610-611

The PROF 118 may then control the energy de-multiplexer 117 based on the allotment decision by opening, action 610, or closing, action 611, the appropriate PV controls.

Figure 7A:
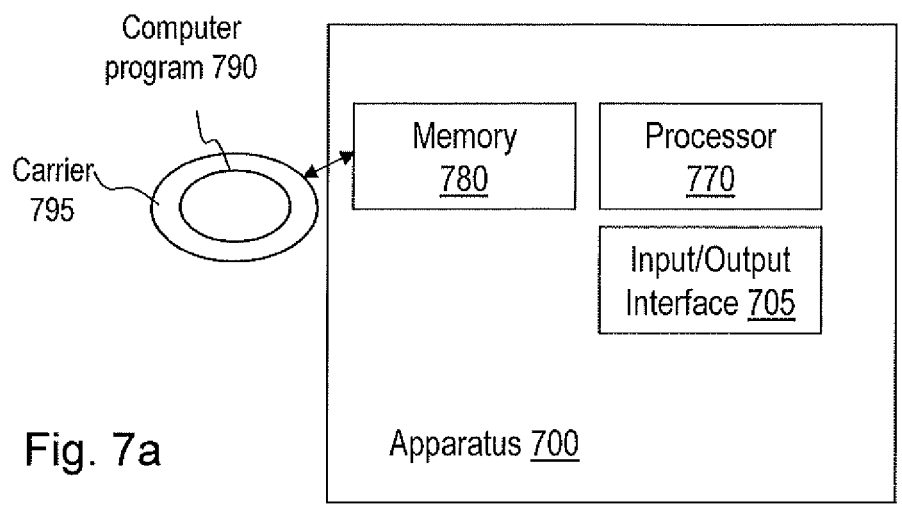
FIGS. 7a and 7b are schematic block diagrams illustrating embodiments of an apparatus.
Figure 7B:
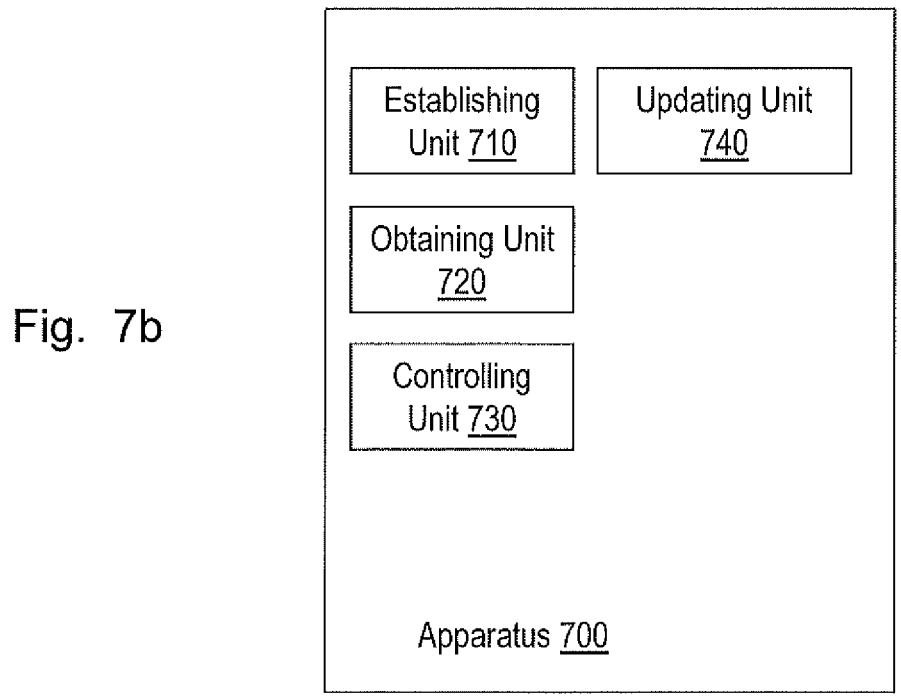

The decision algorithm to actuate the power controls may more formally be as follows:

Predict $PA_{1pw}, PA_{2pw}, \ldots, PA_{npw}$ for $PA_1, PA_2, \ldots PA_n$
Predict $PV_{pwr}$
Find $PA_{max}=\max(PA_{1pw}, PA_{2pw}, \ldots, PA_{npw})$
  If $PA_{max}<=PV_{pwr}$
    If $PV_{controlmax}$==OPEN
      $PV_{controlmax}$=CLOSED
    Set all other $PV_{control}$ to OPEN
  ELSE
    Adjust voltage using $V_{adjust}$
    If $PV_{controlmax}$==OPEN
      $PV_{controlmax}$=CLOSED
    Set all other $PV_{control}$ to OPEN To perform the method actions above for controlling allotment of power input between at least two Power Amplifiers, PAs, of a radio unit 110 for data communication, the apparatus 700 may comprise the arrangement depicted in FIGS. 7a and 7b. As mentioned above, the radio unit 110 has access to DC power and PV power.

The apparatus 700 may comprise an input and output interface 705 configured to communicate with network nodes. The input and output interface 705 may comprise a wireless receiver (not shown) and a wireless transmitter (not shown).

The apparatus 700 is configured to establish the amount of power to be transmitted out from each respective PA out of the at least two PAs, e.g. by means of an establishing unit 710 in the apparatus 700.

The apparatus 700 may further be configured to, e.g. by means of the establishing unit 710 in the apparatus 700, establish at least one first PA out of the at least two PAs, which at least one first PA will be transmitting the most amount of power out of the at least two PAs, and when the PV power available exceeds a first threshold value, allot all of the PV power to the at least one first PA.

The amount of power to be transmitted out from each respective PA out of the at least two PAs may be adapted to be established based on machine learning.

The apparatus 700 is further configured to obtain information related to the amount of PV power available, e.g. by means of an obtaining unit 720 in the apparatus 700.

The information related to the amount of PV power available may be adapted to be related to any one or more out of current power measurements of the PV power, historical power measurements of the PV power, the current weather surrounding the radio unit 110, and the historic weather surrounding the radio unit 110 to description.

The information related to the amount of PV power 114 available may be adapted to be obtained based on machine learning.

The apparatus 700 is further configured to, e.g. by means of a controlling unit 730 in the apparatus 700, control the allotment of power input of DC power and PV power between the at least two PAs based on:
  the established amount of power to be transmitted out from each respective PA out of the at least two PAs, and
  the obtained information related to the amount of PV power available.

The apparatus 700 may further be configured to, e.g. by means of an updating unit 740 in the apparatus 700, update the control of allotment of power input between the at least two PAs by re-establishing the amount of power to be transmitted out from each respective PA out of the at least two PAs, obtaining updated information related to the amount of PV power available, and controlling the allotment of power input of DC power and PV power between the at least two PAs based on:
  the re-established amount of power to be transmitted out from each respective PA out of the at least two PAs, and
  the obtained updated information related to the amount of PV power available.

The apparatus 700 may be configured to, e.g. by means of the updating unit 740 in the apparatus 700, perform the update at a time interval which is adapted to be related to a Transmission Time Interval, TTI, of the data communication. The updating time interval may be adapted to be determined based on machine learning.

The apparatus 700 may be further configured to, e.g. by means of the updating unit 740 in the apparatus 700, update the control of allotment of power input between the at least two PAs by being configured to re-establish at least one second PA, which second PA will be transmitting the most amount of power out of the at least two PAs, and when the PV power available exceeds a first threshold value, allot all of the PV power to the second PA.

The apparatus 700 may be further configured to, e.g. by means of the establishing unit 710 in the apparatus 700, establish the amount of power to be transmitted out from each PA out of the at least two PAs by a respective previous prediction of the amount of power to be transmitted out from each respective PA out of the at least two PAs, wherein the respective prediction is based on the amount of historical traffic generated.

The apparatus 700 may be further configured to, e.g. by means of the obtaining unit 740 in the apparatus 700, obtain the amount of PV power available by a previous prediction of the amount of PV power available, wherein the previous prediction is adapted to be based on one or more out of PV power production, light irradiation, temperature and time of day.

The apparatus 700 may be any one or more out of the radio unit 110, a separate non-virtualized node or a separate node hosted in a public or private cloud such as e.g. the cloud 130, e.g. a server in a cloud 130.

The embodiments herein may be implemented through a respective processor or one or more processors, such as a processor 770 of a processing circuitry in the apparatus 700 depicted in FIG. 7a together with respective computer program code for performing the functions and actions of the embodiments herein. The program code mentioned above may also be provided as a computer program product, for instance in the form of a data carrier carrying computer program code for performing the embodiments herein when being loaded into apparatus 700. One such carrier may be in the form of a CD ROM disc. It is however feasible with other data carriers such as a memory stick. The computer program code may furthermore be provided as pure program code on a server and downloaded to the apparatus 700.

The apparatus 700 may further comprise a memory 780 comprising one or more memory units. The memory 780 comprises instructions executable by the processor in the apparatus 700.

The memory 780 is arranged to be used to store e.g. data, configurations, and applications to perform the methods herein when being executed in the apparatus 700.

In some embodiments, a computer program 790 comprises instructions, which when executed by the at least one processor 770 cause the at least one processor of the apparatus 700 to perform the actions above.

In some embodiments, a carrier 795 comprises the respective computer program, wherein the carrier 795 is one of an electronic signal, an optical signal, an electromagnetic signal, a magnetic signal, an electric signal, a radio signal, a microwave signal, or a computer-readable storage medium.

Radio Unit Implementation

Herein an example of the radio unit implementation described in conjunction with FIG. 2 above is described. In the example it is assumed that PA PA1 in FIG. 2 is allocated 20% of the traffic and PA PA2 is allocated 60% of the traffic, and that PV power 114 is available. Then, the energy de-multiplexer 117 may activate PV control pin number 2 in order to connect the PV power 114 with the PA PA2, and thereby reducing the energy requirements of the DC/DC unit 113. The PV power 114 source may preferably match the PA voltage, e.g. +35 VDC, to be able to support the same voltage range as the PA. The power from the PV may also be matched. For instance, assuming that the radio total consumption is 600 W, the PV power source may support the radio unit 110 with 300 W peak power.

Cloud Implementation

As was described above in conjunction with FIG. 3, the PROF 118 may comprise the PROF server 118a and the PROF client 118b. The PROF server 118a may be responsible for determining, e.g. by computation, which PA or which several PAs that are to be connected to the PV power 114. If a de-multiplexer 117 is utilized as is illustrated in FIG. 3, the PROF server 118a determines which actuator in the demux 117 to actuate. Thus, the PROF server 118a may be a pure software function that may be running in a cloud 130, e.g. on a server in a datacenter e.g. using Infrastructure as a Service, IaaS, or Platform as a Service, PaaS, software. For instance, the PROF 118a could be docker containers, or set of containers, running on top of OpenStack, Kubernetes, Cloudify or any similar platform. For every radio 110 in every site, one of these containers, or set of containers, may be running one instance. The instance may then reside and execute on the same cloud infrastructure as other instances while being unaffected performance-wise by the performance of the other instances running in the network. This implementation may also be scaled up or down very easily for multiple sites. One instance may manage one radio unit 110 or one instance may manage multiple radio units 110. The PROF sever 118a may accept the scheduled traffic or power to be transmitted by the PAs and the PV power 114 available, e.g. through PV readings, as well as any supplementary data such as irradiation etc., as input, and may over time build two models. One of the models may be modeling the radio traffic and the other model may be modeling the PV power 114 production. The PROF server 118a then decides on an actuation plan using these two models, i.e. e.g. to which PA the PV power 114 should be distributed and for how long a time. Then it may submit the actuation plan to the PROF client 118b.

The PROF client 118b may thus receive the actuation plan from PROF server 118a, e.g. through the radio traffic controller 119. Based on the information received the PROF client 118b may control which PA is connected to the PV power 114, e.g. by actuating the controls in the demux 117. It may also report to the PROF server 118a the current PV power 114 production, e.g. by transmitting data obtained by measuring the current voltage and current. If the PROF server 118a needs additional information to e.g. train a PV production model using machine learning, the PROF client 118b may collect additional assorted information such as irradiation and temperature and transmit to the PROF server 118a.

In the cloud implementation scenario, the radio traffic controller 119 may relay information between PROF Client 118b and the PROF server 118a. In addition, the radio traffic controller 119 may compute its own traffic allocation estimates and provide the PROF server 118a with that information. This information may be used by the PROF server 118a to e.g. train a power allocation model using machine learning.

The distributed cloud implementation scenario will be most beneficial when using machine learning, i.e. for updating time intervals where the predictions are performed for k TTIs in advance, where k>>1.

Further Extensions and Variations

Figure 8:
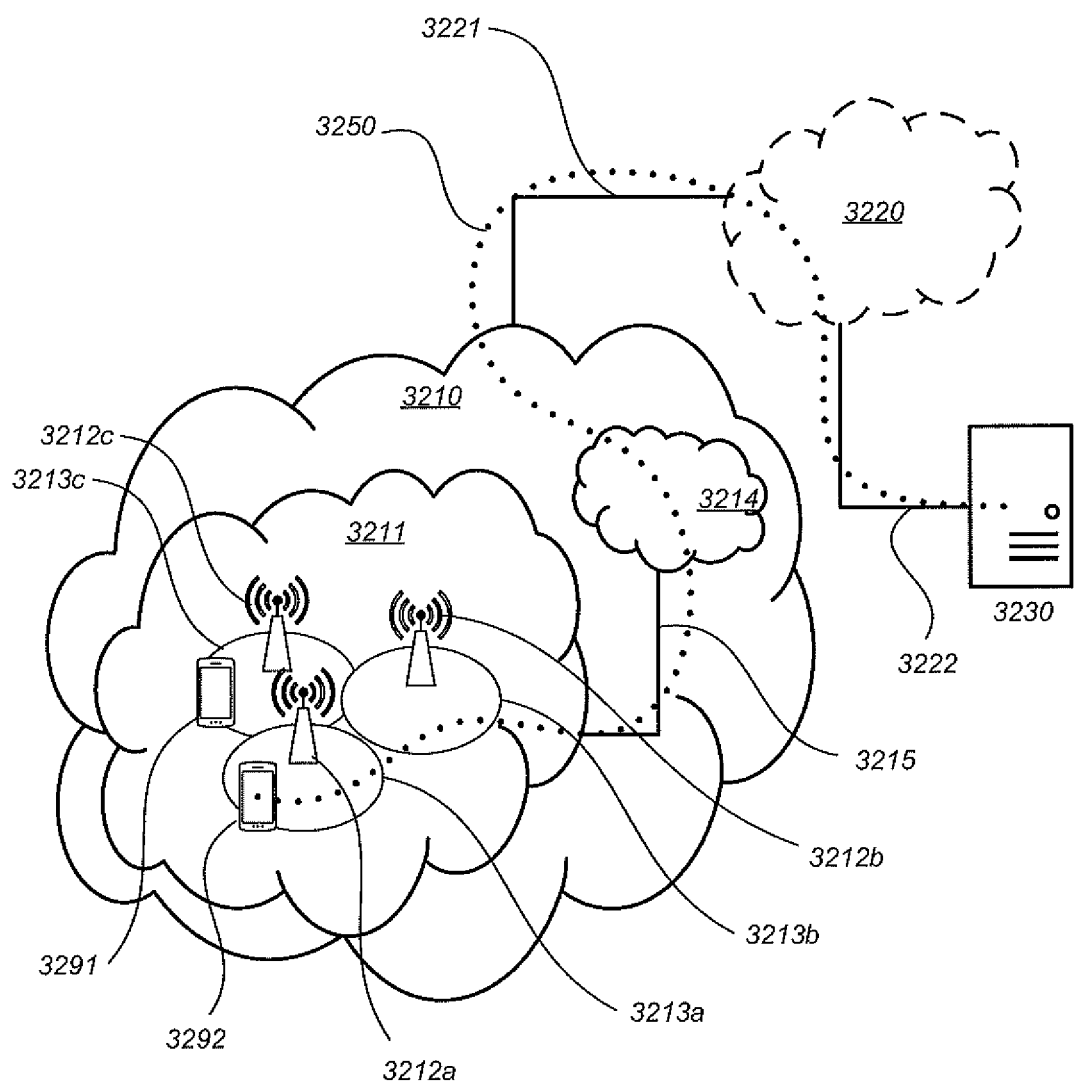
FIG. 8 schematically illustrates a telecommunication network connected via an intermediate network to a host computer.

With reference to FIG. 8, in accordance with an embodiment, a communication system includes a telecommunication network 3210 such as the wireless communications network 100, e.g. an IoT network, or a WLAN, such as a 3GPP-type cellular network, which comprises an access network 3211, such as a radio access network, and a core network 3214. The access network 3211 comprises a plurality of base stations 3212a, 3212b, 3212c, such as e.g. the radio units 110, 120, access nodes, AP STAs NBs, eNBs, gNBs or other types of wireless access points, each defining a corresponding coverage area 3213a, 3213b, 3213c. Each base station 3212a, 3212b, 3212c is connectable to the core network 3214 over a wired or wireless connection 3215. A first user equipment (UE) e.g. the radio unit 110, 120, such as a Non-AP STA 3291 located in coverage area 3213c is configured to wirelessly connect to, or be paged by, the corresponding base station 3212c. A second UE 3292 e.g. the wireless device 122 such as a Non-AP STA in coverage area 3213a is wirelessly connectable to the corresponding base station 3212a. While a plurality of UEs 3291, 3292 are illustrated in this example, the disclosed embodiments are equally applicable to a situation where a sole UE is in the coverage area or where a sole UE is connecting to the corresponding base station 3212.

The telecommunication network 3210 is itself connected to a host computer 3230, which may be embodied in the hardware and/or software of a standalone server, a cloud-implemented server, a distributed server or as processing resources in a server farm. The host computer 3230 may be under the ownership or control of a service provider, or may be operated by the service provider or on behalf of the service provider. The connections 3221, 3222 between the telecommunication network 3210 and the host computer 3230 may extend directly from the core network 3214 to the host computer 3230 or may go via an optional intermediate network 3220. The intermediate network 3220 may be one of, or a combination of more than one of, a public, private or hosted network; the intermediate network 3220, if any, may be a backbone network or the Internet; in particular, the intermediate network 3220 may comprise two or more sub-networks (not shown).

The communication system of FIG. 8 as a whole enables connectivity between one of the connected UEs 3291, 3292 and the host computer 3230. The connectivity may be described as an over-the-top (OTT) connection 3250. The host computer 3230 and the connected UEs 3291, 3292 are configured to communicate data and/or signaling via the OTT connection 3250, using the access network 3211, the core network 3214, any intermediate network 3220 and possible further infrastructure (not shown) as intermediaries. The OTT connection 3250 may be transparent in the sense that the participating communication devices through which the OTT connection 3250 passes are unaware of routing of uplink and downlink communications. For example, a base station 3212 may not or need not be informed about the past routing of an incoming downlink communication with data originating from a host computer 3230 to be forwarded (e.g., handed over) to a connected UE 3291. Similarly, the base station 3212 need not be aware of the future routing of an outgoing uplink communication originating from the UE 3291 towards the host computer 3230.

Example implementations, in accordance with an embodiment, of the UE, base station and host computer discussed in the preceding paragraphs will now be described with reference to FIG. 9. In a communication system 3300, a host computer 3310 comprises hardware 3315 including a communication interface 3316 configured to set up and maintain a wired or wireless connection with an interface of a different communication device of the communication system 3300. The host computer 3310 further comprises processing circuitry 3318, which may have storage and/or processing capabilities. In particular, the processing circuitry 3318 may comprise one or more programmable processors, application-specific integrated circuits, field programmable gate arrays or combinations of these (not shown) adapted to execute instructions. The host computer 3310 further comprises software 3311, which is stored in or accessible by the host computer 3310 and executable by the processing circuitry 3318. The software 3311 includes a host application 3312. The host application 3312 may be operable to provide a service to a remote user, such as a UE 3330 connecting via an OTT connection 3350 terminating at the UE 3330 and the host computer 3310. In providing the service to the remote user, the host application 3312 may provide user data which is transmitted using the OTT connection 3350.

The communication system 3300 further includes a base station 3320 provided in a telecommunication system and comprising hardware 3325 enabling it to communicate with the host computer 3310 and with the UE 3330. The hardware 3325 may include a communication interface 3326 for setting up and maintaining a wired or wireless connection with an interface of a different communication device of the communication system 3300, as well as a radio interface 3327 for setting up and maintaining at least a wireless connection 3370 with a UE 3330 located in a coverage area (not shown) served by the base station 3320. The communication interface 3326 may be configured to facilitate a connection 3360 to the host computer 3310. The connection 3360 may be direct or it may pass through a core network (not shown in FIG. 9) of the telecommunication system and/or through one or more intermediate networks outside the telecommunication system. In the embodiment shown, the hardware 3325 of the base station 3320 further includes processing circuitry 3328, which may comprise one or more programmable processors, application-specific integrated circuits, field programmable gate arrays or combinations of these (not shown) adapted to execute instructions. The base station 3320 further has software 3321 stored internally or accessible via an external connection.

The communication system 3300 further includes the UE 3330 already referred to. Its hardware 3335 may include a radio interface 3337 configured to set up and maintain a wireless connection 3370 with a base station serving a coverage area in which the UE 3330 is currently located. The hardware 3335 of the UE 3330 further includes processing circuitry 3338, which may comprise one or more programmable processors, application-specific integrated circuits, field programmable gate arrays or combinations of these (not shown) adapted to execute instructions. The UE 3330 further comprises software 3331, which is stored in or accessible by the UE 3330 and executable by the processing circuitry 3338. The software 3331 includes a client application 3332. The client application 3332 may be operable to provide a service to a human or non-human user via the UE 3330, with the support of the host computer 3310. In the host computer 3310, an executing host application 3312 may communicate with the executing client application 3332 via the OTT connection 3350 terminating at the UE 3330 and the host computer 3310. In providing the service to the user, the client application 3332 may receive request data from the host application 3312 and provide user data in response to the request data. The OTT connection 3350 may transfer both the request data and the user data. The client application 3332 may interact with the user to generate the user data that it provides.

Figure 9:
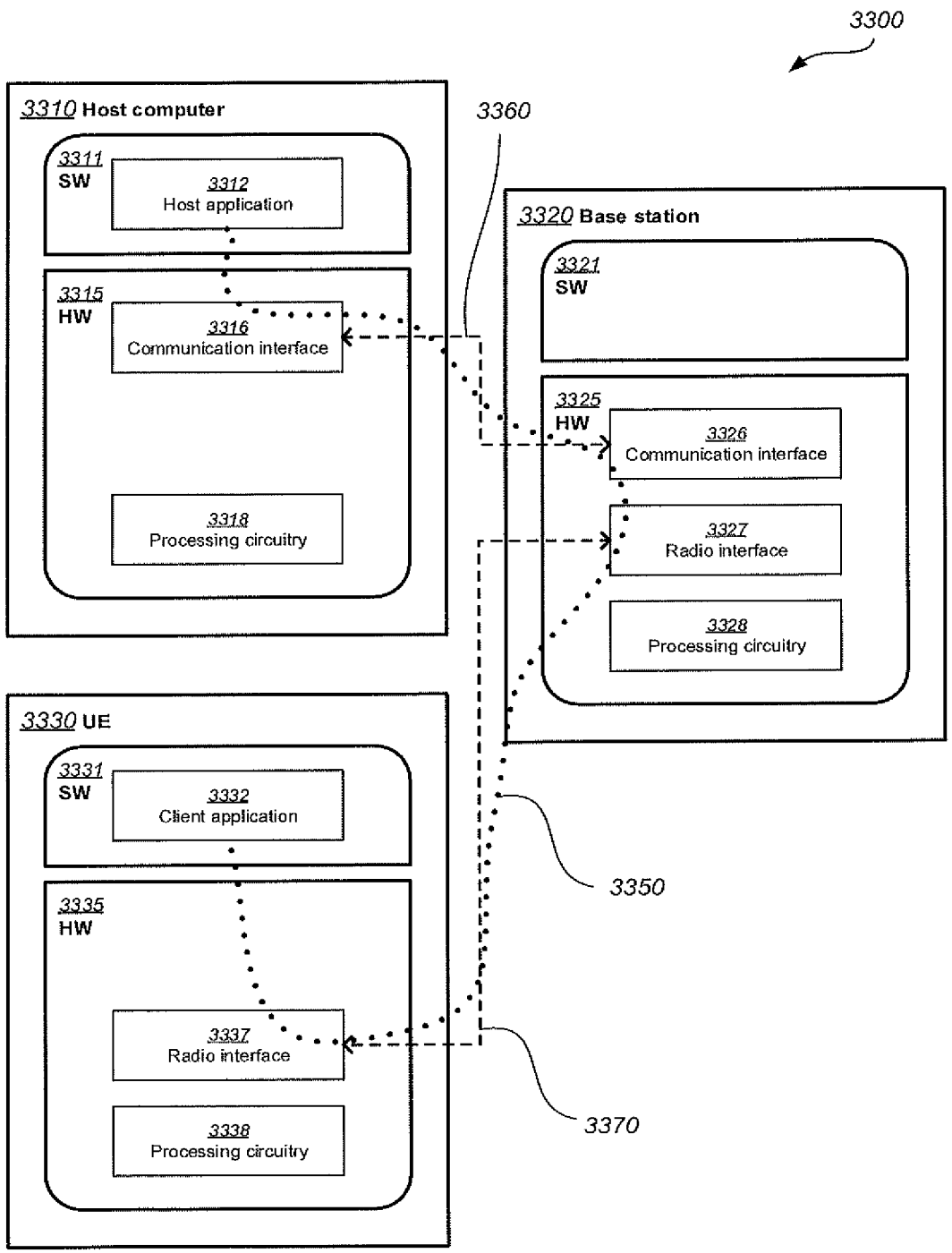
FIG. 9 is a generalized block diagram of a host computer communicating via a base station with a user equipment over a partially wireless connection.
Figure 10:
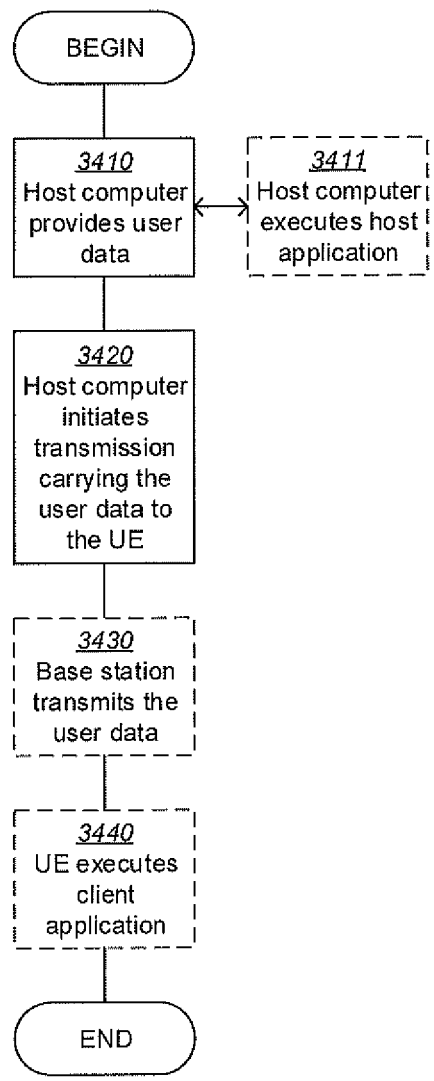

It is noted that the host computer 3310, base station 3320 and UE 3330 illustrated in FIG. 9 may be identical to the host computer 3230, one of the base stations 3212a, 3212b, 3212c and one of the UEs 3291, 3292 of FIG. 10, respectively. This is to say, the inner workings of these entities may be as shown in FIG. 9 and independently, the surrounding network topology may be that of FIG. 8.

In FIG. 9, the OTT connection 3350 has been drawn abstractly to illustrate the communication between the host computer 3310 and the use equipment 3330 via the base station 3320, without explicit reference to any intermediary devices and the precise routing of messages via these devices. Network infrastructure may determine the routing, which it may be configured to hide from the UE 3330 or from the service provider operating the host computer 3310, or both. While the OTT connection 3350 is active, the network infrastructure may further take decisions by which it dynamically changes the routing (e.g., on the basis of load balancing consideration or reconfiguration of the network).

The wireless connection 3370 between the UE 3330 and the base station 3320 is in accordance with the teachings of the embodiments described throughout this disclosure. One or more of the various embodiments improve the performance of OTT services provided to the UE 3330 using the OTT connection 3350, in which the wireless connection 3370 forms the last segment. More precisely, the teachings of these embodiments may improve the applicable RAN effect: data rate, latency, power consumption, and thereby provide benefits such as corresponding effect on the OTT service: e.g. reduced user waiting time, relaxed restriction on file size, better responsiveness, extended battery lifetime.

A measurement procedure may be provided for the purpose of monitoring data rate, latency and other factors on which the one or more embodiments improve. There may further be an optional network functionality for reconfiguring the OTT connection 3350 between the host computer 3310 and UE 3330, in response to variations in the measurement results. The measurement procedure and/or the network functionality for reconfiguring the OTT connection 3350 may be implemented in the software 3311 of the host computer 3310 or in the software 3331 of the UE 3330, or both. In embodiments, sensors (not shown) may be deployed in or in association with communication devices through which the OTT connection 3350 passes; the sensors may participate in the measurement procedure by supplying values of the monitored quantities exemplified above, or supplying values of other physical quantities from which software 3311, 3331 may compute or estimate the monitored quantities. The reconfiguring of the OTT connection 3350 may include message format, retransmission settings, preferred routing etc.; the reconfiguring need not affect the base station 3320, and it may be unknown or imperceptible to the base station 3320. Such procedures and functionalities may be known and practiced in the art. In certain embodiments, measurements may involve proprietary UE signaling facilitating the host computer's 3310 measurements of throughput, propagation times, latency and the like. The measurements may be implemented in that the software 3311, 3331 causes messages to be transmitted, in particular empty or 'dummy' messages, using the OTT connection 3350 while it monitors propagation times, errors etc.

FIG. 10 is a flowchart illustrating a method implemented in a communication system, in accordance with one embodiment. The communication system includes a host computer, a base station such as e.g. the radio unit 110 (which may be a base station or a UE), and a UE such as e.g. the radio unit 110 (which may be a base station or a UE), which may be those described with reference to FIG. 8 and FIG. 9. For simplicity of the present disclosure, only drawing references to FIG. 10 will be included in this section. In a first action 3410 of the method, the host computer provides user data. In an optional subaction 3411 of the first action 3410, the host computer provides the user data by executing a host application. In a second action 3420, the host computer initiates a transmission carrying the user data to the UE. In an optional third action 3430, the base station transmits to the UE the user data which was carried in the transmission that the host computer initiated, in accordance with the teachings of the embodiments described throughout this disclosure. In an optional fourth action 3440, the UE executes a client application associated with the host application executed by the host computer.

Figure 11:
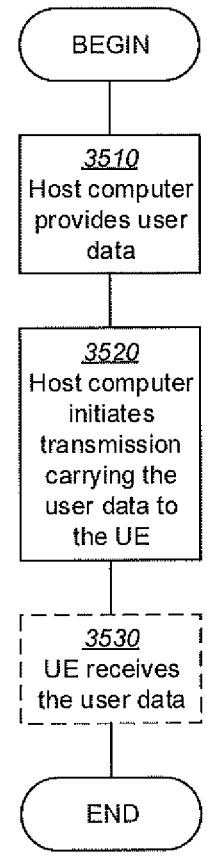

FIG. 11 is a flowchart illustrating a method implemented in a communication system, in accordance with one embodiment. The communication system includes a host computer, a base station such as a AP STA, and a UE such as a Non-AP STA which may be those described with reference to FIG. 8 and FIG. 9. For simplicity of the present disclosure, only drawing references to FIG. 11 will be included in this section. In a first action 3510 of the method, the host computer provides user data. In an optional subaction (not shown) the host computer provides the user data by executing a host application. In a second action 3520, the host computer initiates a transmission carrying the user data to the UE. The transmission may pass via the base station, in accordance with the teachings of the embodiments described throughout this disclosure. In an optional third action 3530, the UE receives the user data carried in the transmission.

FIG. 12 is a flowchart illustrating a method implemented in a communication system, in accordance with one embodiment. The communication system includes a host computer, a base station such as a AP STA, and a UE such as a Non-AP STA which may be those described with reference to FIG. 8 and FIG. 9. For simplicity of the present disclosure, only drawing references to FIG. 12 will be included in this section. In an optional first action 3610 of the method, the UE receives input data provided by the host computer. Additionally or alternatively, in an optional second action 3620, the UE provides user data. In an optional subaction 3621 of the second action 3620, the UE provides the user data by executing a client application. In a further optional subaction 3611 of the first action 3610, the UE executes a client application which provides the user data in reaction to the received input data provided by the host computer. In providing the user data, the executed client application may further consider user input received from the user. Regardless of the specific manner in which the user data was provided, the UE initiates, in an optional third subaction 3630, transmission of the user data to the host computer. In a fourth action 3640 of the method, the host computer receives the user data transmitted from the UE, in accordance with the teachings of the embodiments described throughout this disclosure.

FIG. 13 is a flowchart illustrating a method implemented in a communication system, in accordance with one embodiment. The communication system includes a host computer, a base station such as a AP STA, and a UE such as a Non-AP STA which may be those described with reference to FIG. 8 and FIG. 9. For simplicity of the present disclosure, only drawing references to FIG. 13 will be included in this section. In an optional first action 3710 of the method, in accordance with the teachings of the embodiments described throughout this disclosure, the base station receives user data from the UE. In an optional second action 3720, the base station initiates transmission of the received user data to the host computer. In a third action 3730, the host computer receives the user data carried in the transmission initiated by the base station.

When using the word "comprise" or "comprising" it shall be interpreted as non-limiting, i.e. meaning "consist at least of".

The embodiments herein are not limited to the above described preferred embodiments. Various alternatives, modifications and equivalents may be used.

ABBREVIATION EXPLANATION

PA Power Amplifier
DC Direct Current
PV Photovoltaic
ASIC Application-Specific Integrated Circuit
DPD Digital Pre Distortion
BB Baseband
VDC Voltage Direct Current
NR New Radio
TTI Transmission Time Interval
CPRI Common Public Radio Interface
W Watt
DNN Deep Neural Network
PRC Power Rate Controller
Demux Demultiplexer

The invention claimed is:

1. A method for controlling allotment of power input between at least two Power Amplifiers, PAs, of a radio unit for data communication in a wireless communications network, which radio unit has access to Direct Current, DC, power and Photovoltaic, PV, power, the method comprising:
   establishing the amount of power to be transmitted out from each respective PA out of the at least two PAs,
   obtaining information related to the amount of PV power available,
   controlling the allotment of power input of DC power and PV power between the at least two PAs based on:
      the established amount of power to be transmitted out from each respective PA out of the at least two PAs, and
      the obtained information related to the amount of PV power available.

2. The method according to claim 1, further comprising:
   establishing at least one first PA out of the at least two PAs, which at least one first PA will be transmitting the most amount of power out of the at least two PAs, and
   when the PV power available exceeds a first threshold value, allotting all of the PV power to the at least one first PA.

3. The method according to claim 1, wherein the information related to the amount of PV power available relates to any one or more out of:
   current power measurements of the PV power,
   historical power measurements of the PV power,
   the current weather surrounding the radio unit, and
   the historic weather surrounding the radio unit.

4. The method according to claim 1, further comprising:
   updating the controlling of allotment of power input between the at least two PAs by:
   re-establishing the amount of power to be transmitted out from each respective PA out of the at least two PAs,
   obtaining updated information related to the amount of PV power available,
   controlling the allotment of power input of DC power and PV power between the at least two PAs based on:
      the re-established amount of power to be transmitted out from each respective PA out of the at least two PAs, and
      the obtained updated information related to the amount of PV power available.

5. The method according to claim 4, wherein the updating is performed at a time interval which is related to a Transmission Time Interval, TTI, of the data communication.

6. The method according to claim 1, wherein the information related to the amount of PV power available is obtained based on machine learning and/or the amount of power to be transmitted out from each respective PA out of the at least two PAs is established based on machine learning.

7. The method according to claim 4, further comprising:
wherein the updating the controlling of allotment of power input between the at least two PAs by further comprising:
re-establishing at least one second PA out of the at least two PAs, which second PA will be transmitting the most amount of power out of the at least two PAs, and
when the PV power available exceeds a first threshold value, allotting all of the PV power to the second PA.

8. The method according to claim 1, wherein the amount of power to be transmitted out from each PA out of the at least two PAs is established by a respective previous prediction of the amount of power to be transmitted out from each respective PA out of the at least two PAs, wherein the respective prediction is based on the amount of historical traffic generated.

9. The method according to claim 1, wherein the amount of PV power available is obtained by a previous prediction of the amount of PV power available, wherein the previous prediction is based on one or more out of:
PV power production,
light irradiation,
temperature,
time of day,
altitude at which the PV power source is located, and
efficiency of the PV power source.

10. The method according to claim 1, wherein the actions in the method is performed by any one or more out of:
the radio unit, a separate non-virtualized node or a separate node hosted in a public or private cloud.

11. A non-transitory computer readable medium storing instructions, wherein when the instructions are executed by a processor, the instructions cause the processor to:
establish an amount of power to be transmitted out from each respective PA out of at least two PAs,
obtain information related to the amount of photovoltaic, PV, power available,
control allotment of power input of DC power and PV power between the at least two PAs based on:
the amount of power to be transmitted out from each respective PA out of the at least two PAs, and
the information related to the amount of PV power available.

12. An apparatus configured to control allotment of power input between at least two Power Amplifiers, PAs, of a radio unit for data communication in a wireless communications network, which radio unit is adapted to have access to Direct Current, DC, power and Photovoltaic, PV, power, the device further being configured to:
establish the amount of power to be transmitted out from each respective PA out of the at least two PAs,
obtain information related to the amount of PV power available,
control the allotment of power input of DC power and PV power between the at least two PAs based on:
the established amount of power to be transmitted out from each respective PA out of the at least two PAs, and
the obtained information related to the amount of PV power available.

13. The apparatus according to claim 12, further being configured to:
establish at least one first PA out of the at least two PAs, which at least one first PA will be transmitting the most amount of power out of the at least two PAs, and
when the PV power available exceeds a first threshold value, allot all of the PV power to the at least one first PA.

14. The apparatus according to claim 12, wherein the information related to the amount of PV power available is adapted to be related to any one or more out of:
current power measurements of the PV power,
historical power measurements of the PV power,
the current weather surrounding the radio unit, and
the historic weather surrounding the radio unit.

15. The apparatus according to claim 12, further being configured to:
update the control of allotment of power input between the at least two PAs by:
re-establish the amount of power to be transmitted out from each respective PA out of the at least two PAs,
obtain updated information related to the amount of PV power available,
control the allotment of power input of DC power and PV power between the at least two PAs based on:
the re-established amount of power to be transmitted out from each respective PA out of the at least two PAs, and
the obtained updated information related to the amount of PV power available.

16. The apparatus according to claim 15, wherein the apparatus is configured to perform the update at a time interval which is adapted to be related to a Transmission Time Interval, TTI, of the data communication.

17. The apparatus according to claim 12, wherein the information related to the amount of PV power available is adapted to be obtained based on machine learning and/or the amount of power to be transmitted out from each respective PA out of the at least two PAs is adapted to be established based on machine learning.

18. The apparatus according to claim 15, wherein the apparatus is further configured to update the control of allotment of power input between the at least two PAs by being configured to:
re-establish at least one second PA out of the at least two PAs, which second PA will be transmitting the most amount of power out of the at least two PAs, and
when the PV power available exceeds a first threshold value, allot all of the PV power to the second PA.

19. The apparatus according to claim 12, wherein the apparatus is further configured to establish the amount of power to be transmitted out from each PA out of the at least two PAs by a respective previous prediction of the amount of power to be transmitted out from each respective PA out of the at least two PAs, wherein the respective prediction is based on the amount of historical traffic generated.

20. The apparatus according to claim 12, wherein the apparatus is further configured to obtain the amount of PV power available by a previous prediction of the amount of PV power available, wherein the previous prediction is adapted to be based on one or more out of:
PV power production,
light irradiation,
temperature,
time of day,
altitude at which the PV power source is located, and
efficiency of the PV source.

* * * * *